United States Patent
Kim et al.

(10) Patent No.: US 8,735,932 B2
(45) Date of Patent: May 27, 2014

(54) LIGHT-EMITTING DEVICE INCLUDING A CONNECTION LAYER FORMED ON A SIDE SURFACE THEREOF

(75) Inventors: Tae-hyung Kim, Hwaseong-si (KR); Cheol-soo Sone, Seoul (KR); Jong-in Yang, Suwon-si (KR); Sang-yeob Song, Suwon-si (KR); Si-hyuk Lee, Anyang-si (KR)

(73) Assignee: Samsung Electronics Co., Ltd., Seoul (KR)

( * ) Notice: Subject to any disclaimer, the term of this patent is extended or adjusted under 35 U.S.C. 154(b) by 33 days.

(21) Appl. No.: 13/253,515

(22) Filed: Oct. 5, 2011

(65) Prior Publication Data

US 2012/0119249 A1    May 17, 2012

(30) Foreign Application Priority Data

Nov. 15, 2010    (KR) .................. 10-2010-0113478

(51) Int. Cl.
*H01L 33/36* (2010.01)

(52) U.S. Cl.
USPC  257/99; 257/94; 257/E33.062; 257/E33.066; 438/26; 438/116; 438/119

(58) Field of Classification Search
USPC .......... 257/E23.001, E21.499, E33.056, 700, 257/E33.059, E33.062, 99, E33.066; 438/106, 119
See application file for complete search history.

(56) References Cited

U.S. PATENT DOCUMENTS

| | | | | |
|---|---|---|---|---|
| 2003/0010986 A1* | 1/2003 | Lin et al. | | 257/79 |
| 2008/0128731 A1* | 6/2008 | DenBaars et al. | | 257/98 |
| 2009/0045432 A1* | 2/2009 | Kim et al. | | 257/99 |
| 2009/0173956 A1* | 7/2009 | Aldaz et al. | | 257/94 |
| 2009/0173963 A1* | 7/2009 | Hsu et al. | | 257/99 |
| 2009/0224278 A1* | 9/2009 | Nagai | | 257/99 |
| 2009/0236622 A1* | 9/2009 | Nishihara | | 257/98 |
| 2010/0041170 A1* | 2/2010 | Epler et al. | | 438/26 |
| 2010/0207157 A1* | 8/2010 | Schiaffino et al. | | 257/99 |

FOREIGN PATENT DOCUMENTS

| | | |
|---|---|---|
| KR | 10-0891761 B1 | 3/2009 |
| KR | 10-2009-0113450 A | 11/2009 |
| KR | 10-2009-0116410 A | 11/2009 |
| KR | 10-2010-0044726 A | 4/2010 |

\* cited by examiner

*Primary Examiner* — William F Kraig
*Assistant Examiner* — Pavel Ivanov
(74) *Attorney, Agent, or Firm* — McDermott Will & Emery LLP

(57) ABSTRACT

An LED includes a compound semiconductor structure having first and second compound layers and an active layer, first and second electrode layers atop the second compound semiconductor layer and connected to respective compound layers. An insulating layer is coated in regions other than where the first and second electrode layers are located. A conducting adhesive layer is formed atop the non-conductive substrate, connecting the same to the first electrode layer and insulating layer. Formed on one side surface of the non-conductive substrate and adhesive layer is a first electrode connection layer connected to the conducting adhesive layer. A second electrode connection layer formed on another side surface is connected to the second electrode layer. By forming connection layers on respective side surfaces of the light-emitting device, manufacturing costs can be reduced.

16 Claims, 8 Drawing Sheets

LIGHT-EMITTING DEVICE INCLUDING A CONNECTION LAYER FORMED ON A SIDE SURFACE THEREOF

CROSS-REFERENCE TO RELATED APPLICATIONS

This application claims the benefit of Korean Patent Application No. 10-2010-0113478, filed on Nov. 15, 2010, in the Korean Intellectual Property Office, the disclosure of which is incorporated herein in its entirety by reference.

BACKGROUND

1. Field

The present disclosure relates to light-emitting devices and methods of manufacturing the same.

2. Description of the Related Art

Light-emitting devices, such as light-emitting diodes (LEDs), refer to semiconductor devices that may create various colors of light by constituting a light source through a PN junction of a compound semiconductor. For example, nitride-based LEDs using III-V compound semiconductors such as GaN, InN, and AlN are widely used as light-emitting devices for emitting blue light. Such light-emitting devices have advantages in that they have a long lifespan, are easily made small and light, have a strong directivity of light, and are driven at a low voltage. Also, such light-emitting devices may be applied in various fields because they are strong against impact and vibration, do not need to be preheated, are driven simply, and are packaged in various forms.

There are suggested vertical light-emitting devices which are formed by stacking compound semiconductor layers on an insulating substrate, such as a sapphire substrate that is known to be the most likely substrate satisfying lattice matching conditions for crystal growth, and removing the insulating substrate. Such vertical light-emitting devices are divided into vertical light-emitting devices in which an n-type electrode and a p-type electrode are disposed on the same surface of a compound semiconductor structure and vertical light-emitting devices in which an n-type electrode and a p-type electrode are disposed on different surfaces of a compound semiconductor structure. The vertical light-emitting devices in which the n-type electrode and the p-type electrode are disposed on the same surface of the compound semiconductor structure have advantages in that current spreading is improved and a light passage is prevented from being blocked by the electrodes.

SUMMARY

Provided are light-emitting devices and methods of manufacturing the same which facilitate a manufacturing process and reduce manufacturing cost by forming a connection layer on a side surface of a light-emitting device.

Additional aspects will be set forth in part in the description which follows and, in part, will be apparent from the description, or may be learned by practice of the presented embodiments.

According to an aspect of the present invention, a light-emitting device includes: a compound semiconductor structure which includes a first compound semiconductor layer, an active layer, and a second compound semiconductor layer; a first electrode layer and a second electrode layer which are disposed on a top surface of the second compound semiconductor layer and are respectively electrically connected to the first compound semiconductor layer and the second compound semiconductor layer; an insulating layer which is coated on a portion other than portions where the first electrode layer and the second electrode layer are located; a conducting adhesive layer which is formed on a top surface of a non-conductive substrate and connects the non-conductive substrate to the first electrode layer and the insulating layer; a first electrode connection layer which is formed on one side surfaces of the non-conductive substrate and the conducting adhesive layer and is connected to the conducting adhesive layer; and a second electrode connection layer which is formed on the other side surfaces of the non-conductive substrate and the conducting adhesive layer and is connected to the second electrode layer.

According to another aspect of the present invention, a method of manufacturing a light-emitting device includes: forming a compound semiconductor structure by stacking a first compound semiconductor layer, an active layer, and a second compound semiconductor layer on a substrate; forming a first electrode layer and a second electrode layer, which are respectively electrically connected to the first compound semiconductor layer and the second compound semiconductor layer, on a top surface of the compound semiconductor structure; coating an insulating layer on a portion other than portions where the first electrode layer and the second electrode layer are located; adhering a non-conductive substrate to the insulating layer and the first electrode layer by using a conducting adhesive layer; exposing a portion of the conducting adhesive layer and a portion of a top surface of the second electrode layer; connecting a first electrode connection layer to the conducting adhesive layer; and connecting a second electrode connection layer to the second electrode layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
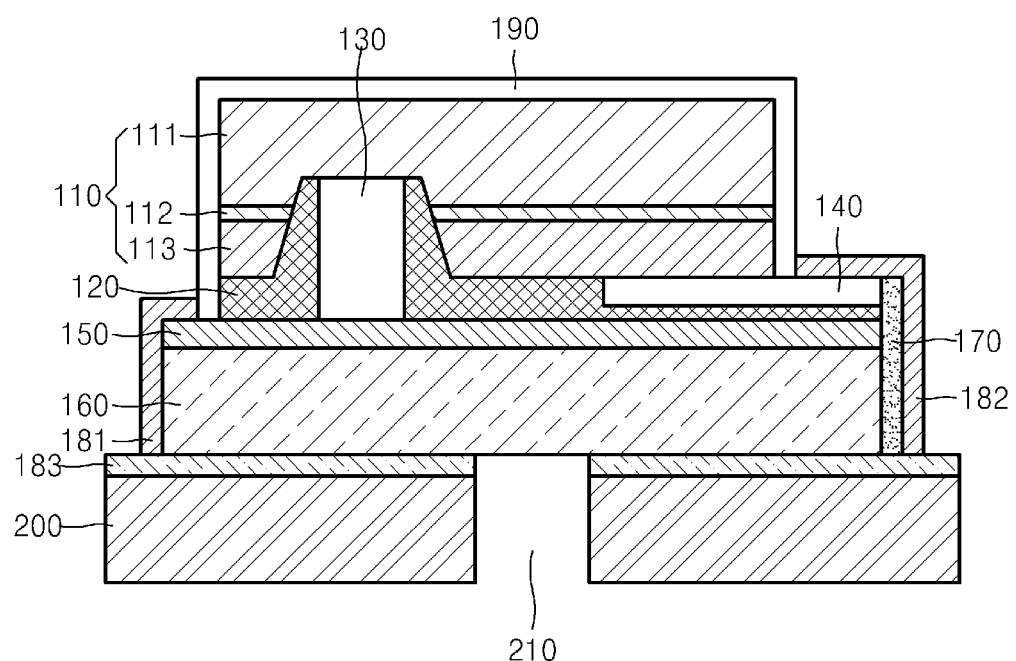
FIG. 1 is a cross-sectional view of a light-emitting device according to an embodiment of the present invention.

FIG. 1 is a cross-sectional view of a light-emitting device according to an embodiment of the present invention.

Referring to FIG. 1, the light-emitting device includes a compound semiconductor structure 110 and an electrode structure disposed on both side surfaces of the compound semiconductor structure 110.

Figure 4:
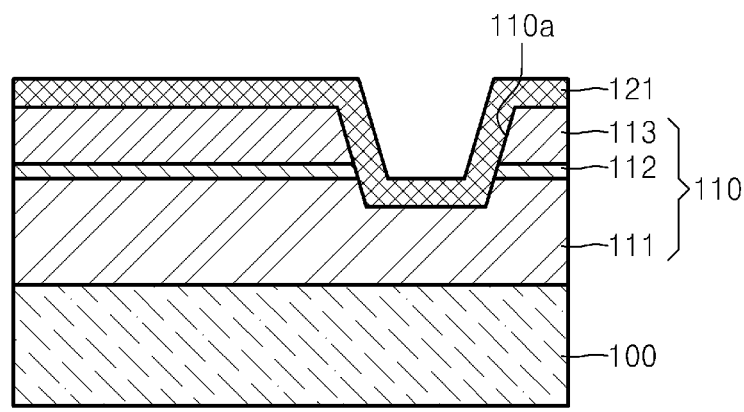

The compound semiconductor structure 110 includes a first compound semiconductor layer 111, an active layer 112, and a second compound semiconductor layer 113 which are grown on a predetermined substrate 100 (see FIG. 4). The substrate 100 may be removed as will be described below (see FIG. 12).

The compound semiconductor structure 110 may be a nitride semiconductor diode which is formed by growing III-V compound semiconductors such as GaN, InN, and AlN. Such nitride semiconductors may be formed by using an insulating substrate such as a sapphire substrate that is known to be the most likely substrate satisfying lattice matching conditions for crystal growth. The first compound semiconductor layer 111 may have n-type conductivity, and the second compound semiconductor layer 113 may have p-type conductivity. If needed, the first compound semiconductor layer 111 may have p-type conductivity, and the second compound semiconductor layer 113 may have n-type conductivity. The active layer 112 is disposed between the first compound semiconductor layer 111 and the second compound semiconductor layer 113. The active layer 112 may have, for example, a multi-quantum well structure. The multi-quantum well structure may include a plurality of quantum well layers and a plurality of quantum barrier layers formed between the quantum well layers. In detail, if the compound semiconductor structure 110 is a gallium nitride-based light-emitting diode, the first compound semiconductor layer 111 may be formed of GaN doped with a n-type impurity, the second compound semiconductor layer 113 may be formed of GaN doped with a p-type impurity, and the active layer 112 may be formed by stacking a plurality of quantum well layers formed of InGaN and a plurality of quantum barrier layers formed of GaN. Electrons and holes injected through the first compound semiconductor layer 111 and the second compound semiconductor layer 113 combine with each other in the active layer 112 to emit light L.

The electrode structure includes a first electrode layer 130 and a second electrode layer 140 disposed on the second compound semiconductor 113, and a first electrode connection layer 181 and a second electrode connection layer 182 respectively electrically connected to the first electrode layer 130 and the second electrode layer 140.

The first electrode layer 130 is electrically connected to the first compound semiconductor layer 111 through a via-hole 110a (see FIG. 4) extending from the second compound semiconductor layer 113 to the first compound semiconductor layer 111. The via-hole 110a may be formed to have a mesa structure or a vertical structure by using etching. One or more via-holes 110a may be formed.

The second electrode layer 140 is disposed on the second compound semiconductor layer 113 and is electrically connected to the second compound semiconductor layer 113. The second electrode layer 140 may be disposed on a portion of the second compound semiconductor layer 113 where the via-hole 110a is not formed.

The insulating layer 120 is coated on a portion of the compound semiconductor structure 110 other than portions where the second electrode layer 140 and the first electrode layer 130 are formed. The first electrode layer 130 is insulated from the active layer 112, the second compound semiconductor layer 113, and the second electrode layer 140 due to the insulating layer 120.

A conducting adhesive layer 150 is coated on a top surface of a non-conductive substrate 160, and the non-conductive substrate 160 is adhered to bottom surfaces of the first electrode layer 130 and the insulating layer 120 by applying a predetermined heat and pressure.

A portion of a top surface of the conducting adhesive layer 150 and a portion of a top surface of the second electrode layer 140 are exposed to the outside. The first electrode connection layer 181 and the second electrode connection layer 182 are disposed on both side surfaces of the non-conductive substrate 160 and the conducting adhesive layer 150. The first electrode connection layer 181 contacts one of the side surfaces of the conducting adhesive layer 150 and the non-conductive substrate 160, and one end of the first electrode connection layer 181 contacts the exposed portion of the top surface of the conducting adhesive layer 150. The second electrode connection layer 182 is disposed to surround the other side surfaces of the conducting adhesive layer 150 and the non-conductive substrate 160, and one end of the second electrode connection layer 182 contacts the exposed portion of the top surface of the second electrode layer 140.

The first electrode connection layer 181 and the second electrode connection layer 182 may be formed by depositing a metal, and the metal may be deposited by using E-beam, sputtering, or plating.

In this case, if both the first electrode connection layer 181 and the second electrode connection layer 182 contact the conducting adhesive layer 150, the first electrode connection layer 181 and the second electrode connection layer 182 are connected and short-circuited. In order to prevent this, an insulating film 170 is disposed between the second electrode connection layer 182, and the non-conductive substrate 160 and the conducting adhesive layer 150. Since the insulating film 170 is disposed to directly contact the side surfaces of the non-conductive substrate 160, the conducting adhesive layer 150, and the second electrode layer 140, the second electrode connection layer 182 is prevented from contacting the non-conductive substrate 160 and the conducting adhesive layer 150. The insulating film 170 may be formed of SiOx or SixNy, or polymer, polyimide, or epoxy-based material.

Accordingly, the first electrode connection layer 181 is electrically connected to the first electrode layer 130 through the conducting adhesive layer 150, the second electrode connection layer 182 is electrically connected to the second electrode layer 140, and the first electrode connection layer 181 and the second electrode connection layer 182 are not short-circuited due to the insulating film 170.

A package 200 is adhered to a bottom surface of the non-conductive substrate 160 using a conductive adhesive layer 183. In this case, the first electrode connection layer 181 and the second electrode connection layer 182 are electrically connected to the conductive adhesive layer 183 by contacting the conductive adhesive layer 183. A via-hole 210 is formed in the package 200 and the conductive adhesive layer 183 to reach the non-conductive substrate 160. Accordingly, the first electrode connection layer 181 and the second electrode connection layer 182 are not short-circuited due to the via-hole 210. A protective layer 190 is formed to surround the compound semiconductor structure 110.

Figure 2:
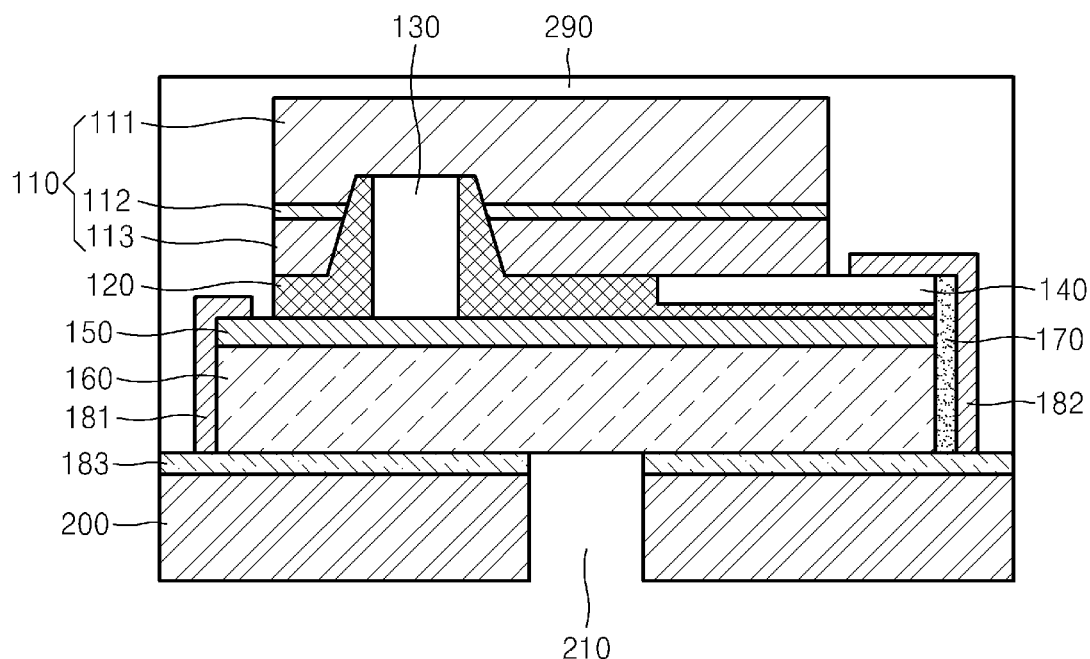
FIG. 2 is a cross-sectional view of a light-emitting device according to another embodiment of the present invention.

FIG. 2 is a cross-sectional view of a light-emitting device according to another embodiment of the present invention.

Referring to FIG. 2, the light-emitting device is basically identical to the light-emitting device of FIG. 1 in configuration. However, a protective layer 290 is formed to surround not only the compound semiconductor structure 110 but also portions of the first electrode connection layer 181, the second electrode connection layer 182, and the conductive adhesive layer 183 which are exposed. The protective layers 190 and 290 for protecting the compound semiconductor structure 110 and so on from the external environment may be formed of a transparent material through which light is transmitted so as not to disturb light extraction.

In the above configurations, since it is difficult and costly to form a via-hole in the non-conductive substrate 160, the via-hole may not be formed in the non-conductive substrate 160 as shown in the embodiments. A manufacturing process may be facilitated and manufacturing cost may be reduced by forming an electrode on a side surface of the non-conductive substrate 160.

FIGS. 3 through 15 are cross-sectional views for explaining a method of manufacturing the light-emitting device of FIG. 1, according to an embodiment of the present invention. Although one light-emitting device is manufactured for convenience of explanation in FIGS. 3 through 15, a plurality of light-emitting devices may be actually integrally formed on a wafer and then may be cut into individual light-emitting devices.

Figure 3:
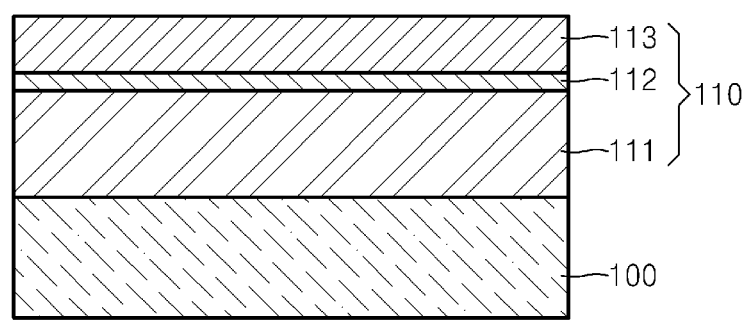
FIGS. 3 through 15 are cross-sectional views for explaining a method of manufacturing the light-emitting device of FIG. 1, according to an embodiment of the present invention.

Referring to FIG. 3, the compound semiconductor structure 110 is formed by sequentially growing the first compound semiconductor layer 111, the active layer 112, and the second compound semiconductor layer 113 on a top surface of the substrate 100.

The substrate 100 may be one suitable for a compound semiconductor to be grown by using crystal growth. For example, if a nitride semiconductor single crystal is to be grown, the substrate 100 may be selected from a sapphire substrate, a zinc oxide (ZnO) substrate, a gallium nitride (GaN) substrate, a silicon carbide (SiC) substrate, and an aluminum nitride (AlN) substrate. Although not shown in FIG. 2, a buffer layer (not shown) may be formed between the substrate 100 and the first compound semiconductor layer 111. The buffer layer, which is a layer for improving lattice matching with the substrate 100 before growing the first compound semiconductor layer 111, may be generally formed of AlN/GaN.

The compound semiconductor structure 110 may be formed by growing III-V compound semiconductors such as GaN, InN, or AlN by using crystal growth. For example, if the compound semiconductor structure 110 is a gallium nitride-based light-emitting diode, the first compound semiconductor layer 111, the active layer 112, and the second compound semiconductor layer 113 may be each formed of a semiconductor material having a formula represented as $Al_xIn_yGa_{(1-x-y)}N$ (where $0 \leq x \leq 1$, $0 \leq y \leq 1$, $0 \leq x+y \leq 1$), and may be formed by using epitaxial growth using metal organic chemical vapor deposition (MOCVD) equipment. That is, the first compound semiconductor layer 111 may be formed as a GaN or GaN/AlGaN layer doped with a first conductive impurity such as silicon (Si), germanium (Ge), or tin (Sn). The active layer 112 may be formed as an InGaN/GaN layer having a multi-quantum well structure, or one quantum well layer or a double hetero structure. The second compound semiconductor layer 113 may be formed as a GaN or GaN/AlGaN layer doped with a second conductive impurity such as magnesium (Mg), zinc (Zn), or beryllium (Be).

Next, referring to FIG. 4, a portion of the compound semiconductor structure 110 where the first electrode layer 130 (see FIG. 1) is to be formed is etched to a predetermined depth from the second compound semiconductor layer 113 to form the via-hole 110a and expose a portion of the first compound semiconductor layer 111. The via-hole 110a may be formed to have a mesa structure or a vertical structure. A plurality of the via-holes 110a may be formed to correspond to a plurality of the first electrode layers 130. Next, a passivation layer 121 is coated by using a well-known deposition method on an entire top surface of the compound semiconductor structure 110. For example, the passivation layer 121 may be formed by depositing $SiO_2$ to a thickness of about 6000 Å by using plasma enhanced chemical vapor deposition (PECVD).

Figure 5:
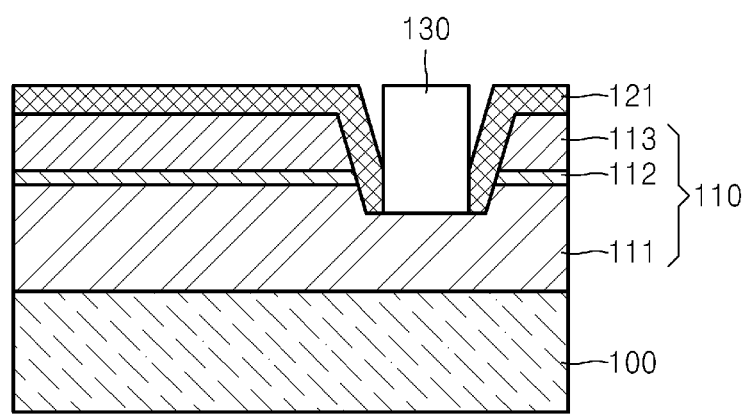

Next, referring to FIG. 5, a portion of the first compound semiconductor layer 111 is exposed by etching a portion of the passivation layer 121 which is formed at the bottom of the via-hole 110a. The etching may be performed by using reactive ion etching (RIE) and a buffered oxide etchant (BOE). Next, the first electrode layer 130 is formed on the exposed portion of the first compound semiconductor layer 111. For example, the first electrode layer 130 may be formed by depositing an Al/Ti/Pt layer to a thickness of 200 nm/1200 nm/20 nm. In this case, current spreading to the first compound semiconductor layer 111 may be improved by forming a plurality of the first electrode layers 130.

Figure 6:
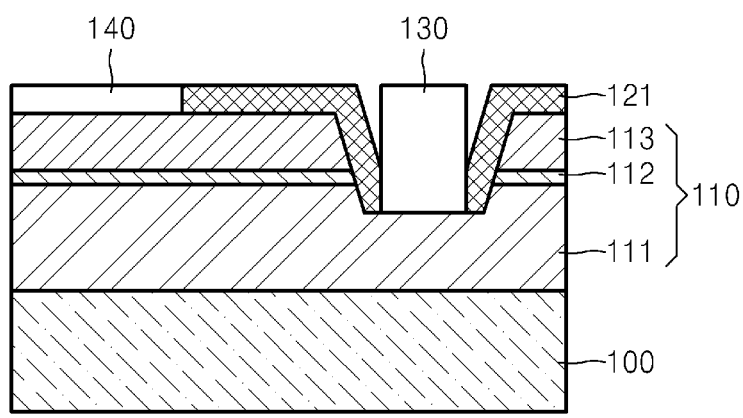

Referring to FIG. 6, a portion of the second compound semiconductor layer 113 is exposed by etching a portion of the passivation layer 121 other than a portion surrounding the first electrode layer 130. The etching may be performed by using, for example, RIE and a BOE. Next, the second electrode layer 140 is formed on the exposed portion of the second compound semiconductor layer 113. In this case, the second electrode layer 140 is formed to be spaced apart from the first electrode layer 130. The second electrode layer 140 may act as a reflective film formed of a metal having both ohmic characteristics and light reflecting characteristics, or may be formed as layers formed by sequentially stacking metals having ohmic characteristics and light reflecting characteristics. For example, the second electrode layer 140 may be formed by depositing a Ni/Ag/Pt/Ti/Pt layer to a thickness of 0.5 nm/250 nm/50 nm/300 nm/50 nm.

Figure 7:
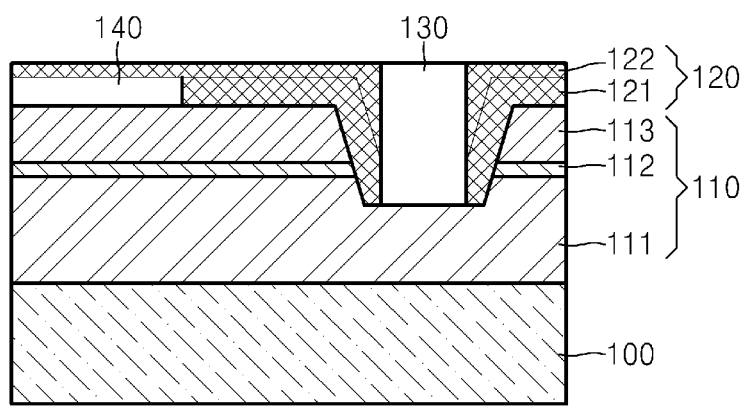

Next, referring to FIG. 7, an insulating material layer 122 is coated to a predetermined thickness on the top surface of the compound semiconductor structure 110. The insulating material layer 122 is coated on a region including the first electrode layer 130, the second electrode layer 140, and the passivation layer 121. The insulating material layer 122 may be formed by, for example, depositing $SiO_2$ to a thickness of about 8000 Å by using PECVD. The passivation layer 121 and the insulating material layer 122 may be formed of the same material, and constitute the insulating layer 120 with respect to the first electrode layer 130 and the second electrode layer 140.

A portion of the insulating material layer 122 covering a top surface of the first electrode layer 130 is removed, and an Al/Ti/Pt layer for forming the first electrode layer 130 is filled in the removed portion, to integrally form the first electrode layer 130. Then, the first electrode layer 130 is exposed to the outside of the insulating material layer 122. Accordingly, while the first electrode layer 130 is exposed to the outside of the insulating material layer 122, the second electrode layer 140 is blocked from the outside due to the insulating material layer 120.

Figure 8:
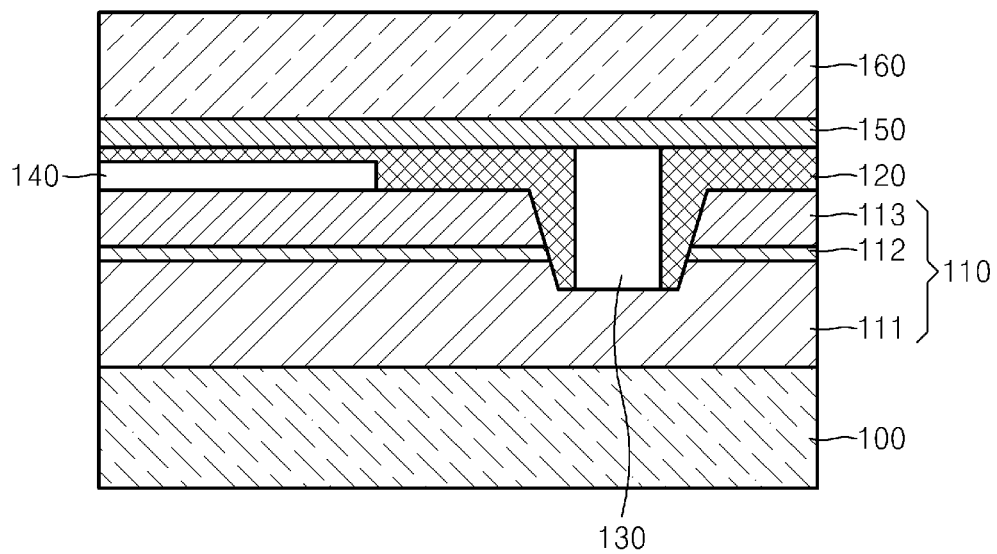

Referring to FIG. 8, the conducting adhesive layer 150 is coated on a top surface of the non-conductive substrate 160, and then the non-conductive substrate 160 is adhered to the first electrode layer 130 and the insulating layer 120 by applying a predetermined heat and pressure. The non-conductive substrate 160 is adhered to the conducting adhesive layer 150 by applying a heat higher than 300° C. and a predetermined pressure to the first electrode layer 130 and the insulating layer 120. Then, while the first electrode layer 130 contacts the conducting adhesive layer 150, the second electrode layer 140 is separated from the conducting adhesive layer 150 due to the insulating layer 120.

Since a heat higher than 300° C. is applied during adhesion to the non-conductive substrate 160 that acts as a final support layer for the light-emitting device, it is preferable that the non-conductive substrate 160 has a thermal expansion coefficient that is similar to that of the substrate 100.

Figure 9:
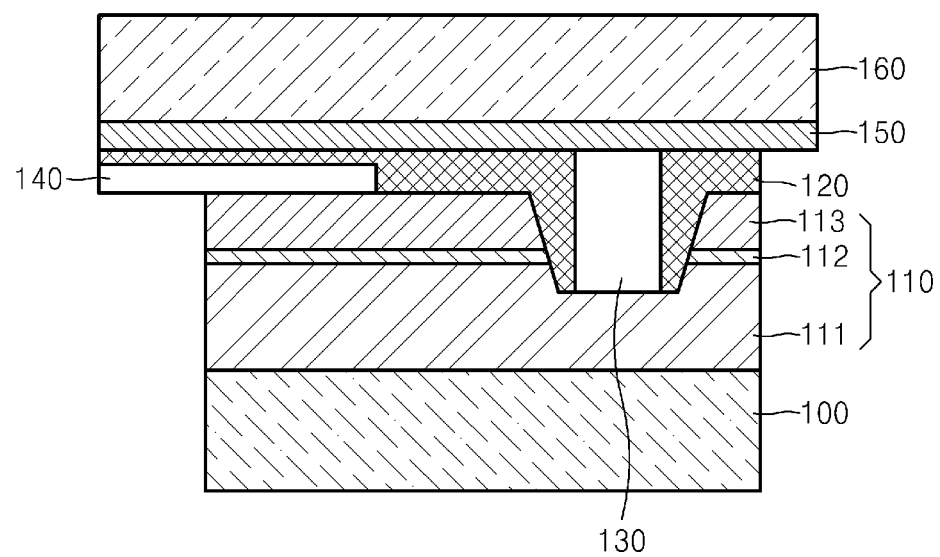

Referring to FIG. 9, a portion of the conducting adhesive layer 150 is exposed by etching portions of the insulating layer 120, the compound semiconductor structure 110, and the substrate 100 adjacent to the first electrode layer 130. A portion of the second electrode layer 140 is exposed by etching portions of the compound semiconductor structure 110 and the substrate 100 disposed on a top surface of the second electrode layer 140. The etching may be performed by using, for example, RIE and a BOE.

Figure 10:
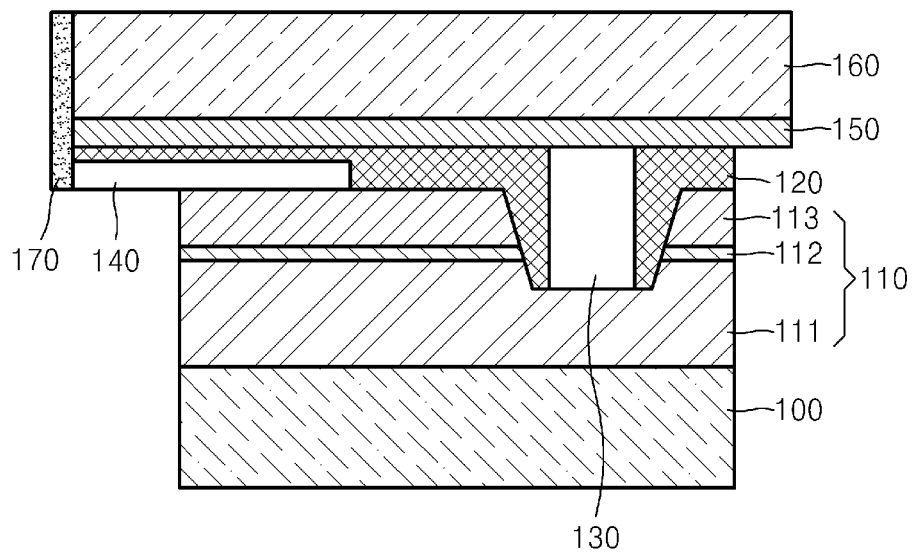

Referring to FIG. 10, the insulating film 170 is formed to a predetermined thickness on side surfaces of the second conductive layer 140, the conducting adhesive layer 150, and the non-conductive substrate 160. Accordingly, the side surfaces of the second electrode layer 140, the conducting adhesive layer 150, and the non-conductive substrate 160 are surrounded by the insulating film 170. The insulating film 170 may be formed SiOx or SixNy, or polymer, polyimide, or epoxy-based material.

Figure 11:
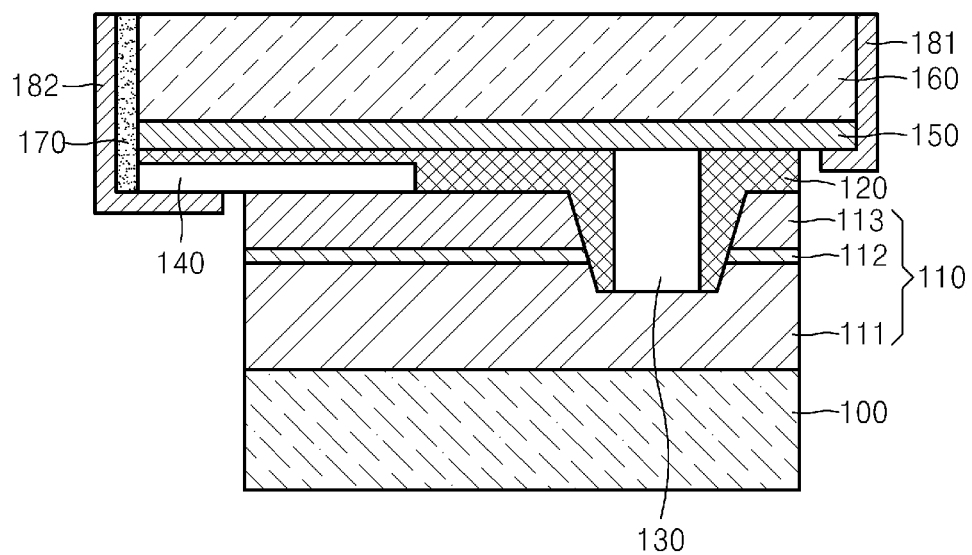

Referring to FIG. 11, the first electrode connection layer 181 is formed to surround the exposed portion of the top surface of the conducting adhesive layer 150 and the side surface of the non-conductive substrate 160. The second electrode connection layer 182 is formed to surround the insulating film 170 and the exposed portion of the top surface of the second electrode layer 140. The first electrode connection layer 181 and the second electrode connection layer 182 may be formed by depositing a metal, such as copper, nickel, or chromium, and the metal may be deposited by using E-beam, sputtering, or plating. In this case, one end of the first electrode connection layer 181 is formed on the top surface of the conducting adhesive layer 150 to be spaced apart by a predetermined interval from the insulating layer 120. One end of the second electrode connection layer 182 is formed on the top surface of the second electrode layer 140 to be spaced apart by a predetermined interval from the second compound semiconductor layer 113. This is to have a space for forming the protective layer 190 (see FIG. 13) that is to be formed to surround the compound semiconductor structure 110.

Figure 12:
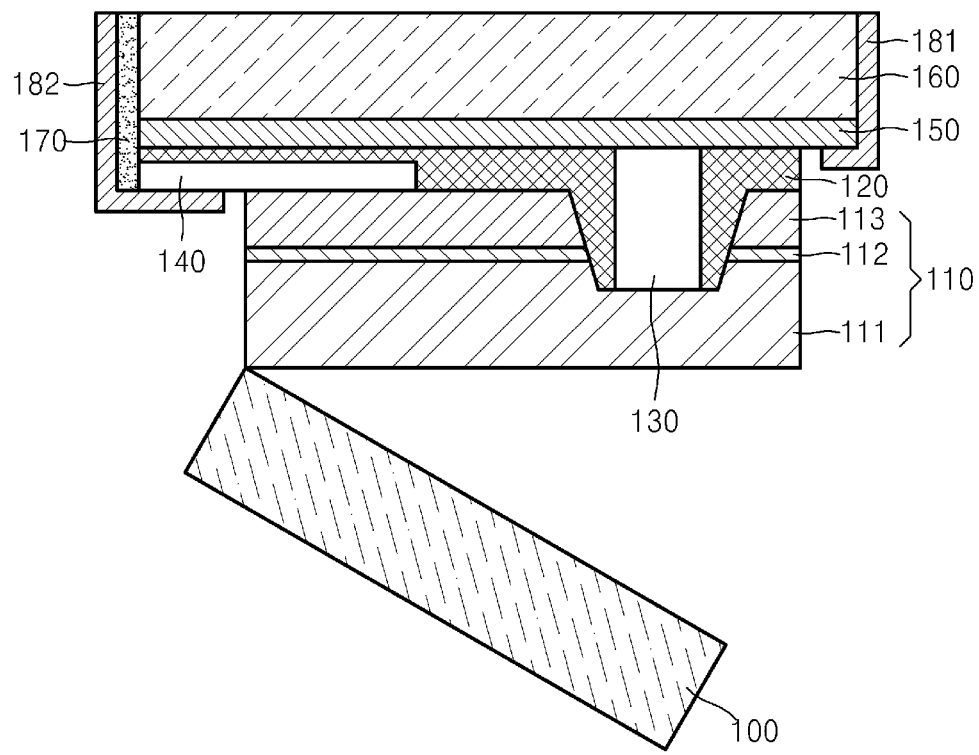

Next, referring to FIG. 12, the substrate 100 is removed from the compound semiconductor structure 110. Since the top surface of the compound semiconductor structure 110 is a surface for extracting light, the substrate 100 is removed in order to improve light extraction efficiency. Although not shown, a concave-convex structure may be formed on the top surface of the compound semiconductor structure 110 in order to improve light extraction efficiency.

Figure 13:
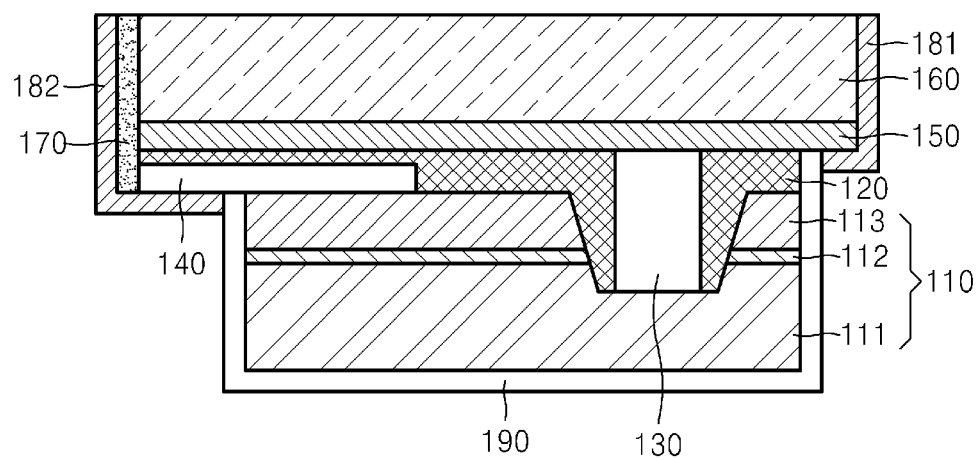

Referring to FIG. 13, the protective layer 190 is formed to surround the compound semiconductor structure 110. The protective layer 190 for protecting the compound semiconductor structure 110 from the external environment may be formed of a transparent material through which light is transmitted so as not to disturb light extraction.

Figure 14:
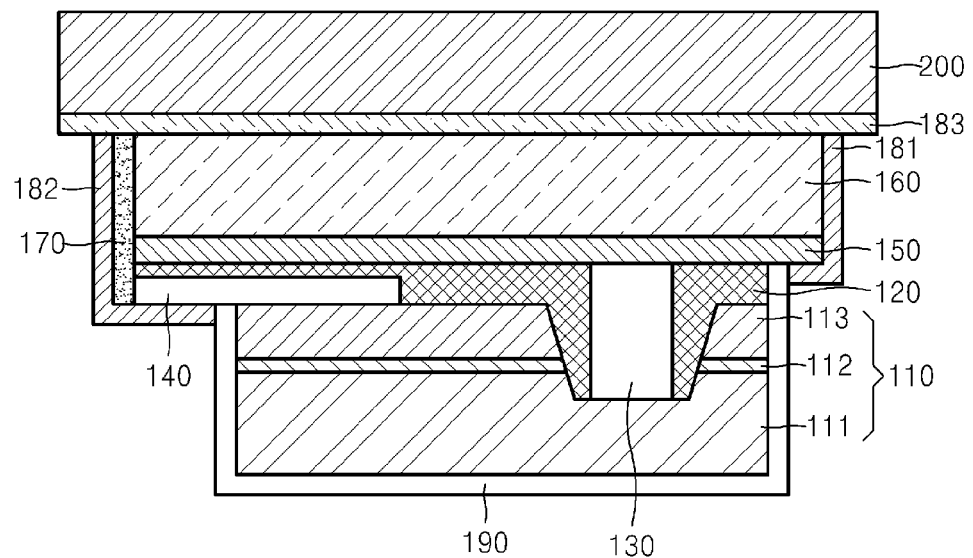

Referring to FIG. 14, the conductive adhesive layer 183 is coated on a top surface of the package 200, and then the package 200 is adhered to the first electrode connection layer 181, the non-conductive substrate 160, the insulating film 170, and the second electrode connection layer 182. In this case, the first electrode connection layer 181 and the second electrode connection layer 182 are adhered and connected to the conductive adhesive layer 183.

Figure 15:
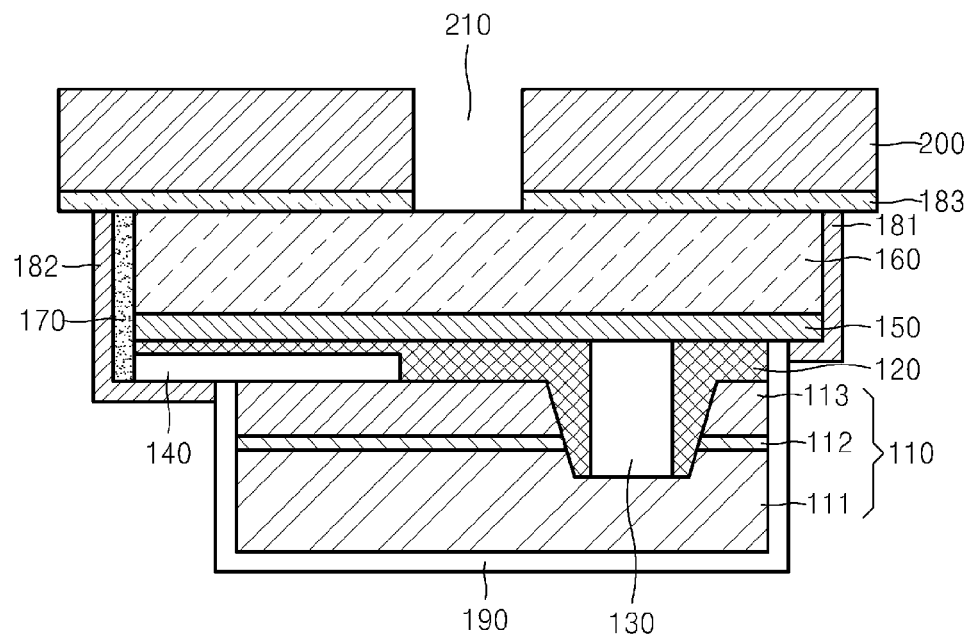

Referring to FIG. 15, a portion of the non-conductive substrate 160 is exposed by forming the via-hole 210 that passes through the package 200 and the conductive adhesive layer 183. In this case, the first electrode connection layer 181 and the second electrode connection layer 182 are not short-circuited due to the via-hole 210. The via-hole 210 may be formed by using various methods such as drilling, ultrasonic milling, laser drilling, sand blasting, or dry etching, or a combination of the methods.

What is claimed is:

1. A light-emitting device comprising:
   a compound semiconductor structure which comprises a first compound semiconductor layer, an active layer, and a second compound semiconductor layer;
   a first electrode layer and a second electrode layer which are disposed on a surface of the second compound semiconductor layer and are respectively electrically connected to the first compound semiconductor layer and the second compound semiconductor layer;
   an insulating layer which is coated on a portion of the compound semiconductor structure;
   a conducting adhesive layer which is formed on a top surface of a non-conductive substrate and connects the non-conductive substrate to the first electrode layer and the insulating layer, the conducting adhesive layer continuously extending on the top surface of the non-conductive substrate to cover the entire area of the top surface of the non-conductive substrate;
   a first electrode connection layer which is formed on one side surface of the non-conductive substrate and the conducting adhesive layer and is connected to the conducting adhesive layer; and
   a second electrode connection layer which is formed on another side surface of the non-conductive substrate and the conducting adhesive layer and is connected to the second electrode layer,
   wherein the insulating layer extends from the compound semiconductor structure to the conducting adhesive layer, and
   wherein the insulating layer includes a reduced-thickness portion, the second electrode layer arranged on the reduced-thickness portion.

2. The light-emitting device of claim 1, wherein the first electrode connection layer is electrically connected to the first electrode layer through the conducting adhesive layer.

3. The light-emitting device of claim 1, further comprising an insulating film which is disposed between the second electrode connection layer and the conducting adhesive layer.

4. The light-emitting device of claim 3, wherein the insulating film extends to cover a side surface of the second electrode layer and a side surface of the non-conductive substrate.

5. The light-emitting device of claim 1, wherein the second electrode connection layer is connected to an upper side of the second electrode layer.

6. The light-emitting device of claim 1, wherein the non-conductive substrate, the first electrode connection layer, and the second electrode connection layer are connected to a package by a conductive adhesive layer, and a via-hole is formed in the conductive adhesive layer and the package to prevent a short-circuit between the first electrode connection layer and the second electrode connection layer.

7. The light-emitting device of claim 1, further comprising a protective layer which is disposed to surround the compound semiconductor structure.

8. The light-emitting device of claim 1, further comprising a protective layer which is disposed to surround the compound semiconductor structure, the first electrode connection layer, and the second electrode connection layer.

9. A light-emitting device comprising:
   a compound semiconductor structure which comprises a first compound semiconductor layer, an active layer, and a second compound semiconductor layer;
   a first electrode layer and a second electrode layer which are disposed on a surface of the second compound semiconductor layer and are respectively electrically connected to the first compound semiconductor layer and the second compound semiconductor layer;
   an insulating layer which is coated on a portion of the compound semiconductor structure;
   a conducting adhesive layer continuously extending on a top surface of a non-conductive substrate to cover the entire area of the top surface of the non-conductive substrate, the conducting adhesive layer being in contact with the first electrode layer and the insulating layer;

a first electrode connection layer formed on one side surface of the non-conductive substrate and on one side surface of the conducting adhesive layer and connected to the conducting adhesive layer; and a second electrode connection layer formed on another side surface of the non-conductive substrate and on another side surface of the conducting adhesive layer and connected to the second electrode layer.

10. The light-emitting device of claim 9, wherein the first electrode connection layer is electrically connected to the first electrode layer through the conducting adhesive layer.

11. The light-emitting device of claim 9, further comprising an insulating film which is disposed between the second electrode connection layer and the conducting adhesive layer.

12. The light-emitting device of claim 11, wherein the insulating film extends to cover a side surface of the second electrode layer and the another side surface of the non-conductive substrate.

13. The light-emitting device of claim 9, wherein the second electrode connection layer is connected to an upper side of the second electrode layer.

14. The light-emitting device of claim 9, further comprising:
a package; and
a conductive adhesive layer interposed between the non-conductive substrate and the package,
wherein the first electrode connection layer and the second electrode connection layer are connected to the package through the conductive adhesive layer.

15. The light-emitting device of claim 9, further comprising a protective layer surrounding the compound semiconductor structure on the conducting adhesive layer.

16. The light-emitting device of claim 9, further comprising a protective layer surrounding the compound semiconductor structure, the first electrode connection layer, and the second electrode connection layer.

* * * * *